United States Patent
Liu et al.

(10) Patent No.: US 10,134,983 B2
(45) Date of Patent: Nov. 20, 2018

(54) NONVOLATILE RESISTIVE SWITCHING MEMORY DEVICE AND MANUFACTURING METHOD THEREOF

(71) Applicant: Institute of Microelectronics, Chinese Academy of Sciences, Beijing (CN)

(72) Inventors: Qi Liu, Beijing (CN); Ming Liu, Beijing (CN); Haitao Sun, Beijing (CN); Keke Zhang, Beijing (CN); Shibing Long, Beijing (CN); Hangbing Lv, Beijing (CN); Writam Banerjee, Beijing (CN); Kangwei Zhang, Beijing (CN)

(73) Assignee: INSTITUTE OF MICROELECTRONICS, CHINESE ACADEMY OF SCIENCES, Beijing (CN)

( * ) Notice: Subject to any disclaimer, the term of this patent is extended or adjusted under 35 U.S.C. 154(b) by 0 days.

(21) Appl. No.: 15/546,212

(22) PCT Filed: May 14, 2015

(86) PCT No.: PCT/CN2015/079006
§ 371 (c)(1),
(2) Date: Jul. 25, 2017

(87) PCT Pub. No.: WO2016/123882
PCT Pub. Date: Aug. 11, 2016

(65) Prior Publication Data
US 2018/0026183 A1 Jan. 25, 2018

(30) Foreign Application Priority Data
Feb. 5, 2015 (CN) .......................... 2015 1 0061926

(51) Int. Cl.
*H01L 45/00* (2006.01)

(52) U.S. Cl.
CPC .......... *H01L 45/1246* (2013.01); *H01L 45/08* (2013.01); *H01L 45/085* (2013.01);
(Continued)

(58) Field of Classification Search
CPC . H01L 45/1246; H01L 45/08; H01L 45/1266; H01L 45/16; H01L 45/1233
See application file for complete search history.

(56) References Cited

U.S. PATENT DOCUMENTS 8,294,132 B2 * 10/2012 Miao ...................... H01L 45/08
257/1
8,546,785 B2 * 10/2013 Yang .................. H01L 27/2463
257/2

(Continued)

FOREIGN PATENT DOCUMENTS

| CN | 102593097 A | 7/2012 |
|---|---|---|
| CN | 102709293 A | 10/2012 |
| JP | 2011238828 A | 11/2011 |

OTHER PUBLICATIONS

Ye et al., "Thickness-Dependent Strain Effect on the Deformation of the Graphene-Encapsulated Au Nanoparticles", Journal of Nanomaterials, vol. 2014 (2014), Article ID 989672, Published Jan. 9, 2014.*

(Continued)

*Primary Examiner* — Nikolay Yushin
(74) *Attorney, Agent, or Firm* — K&L Gates LLP

(57) ABSTRACT

A nonvolatile resistive switching memory, comprising an inert metal electrode, a resistive switching functional layer, and an easily oxidizable metal electrode, and characterized in that: a graphene barrier layer is inserted between the inert metal electrode and the resistive switching functional layer, which is capable of preventing the easily oxidizable metal ions from migrating into the inert metal electrode through the resistive switching functional layer under the action of electric field during the programming of the device. The (Continued)

manufacturing method therefore comprises adding a monolayer or multilayer graphene thin film between the inert electrode and the solid-state electrolyte resistive switching functional layer which services as a metal ion barrier layer to stop electrically-conductive metal filaments formed in the resistive switching layer from diffusing into the inert electrode layer during a RRAM device programming process, eliminating erroneous programming phenomenon occurring during the erasing process, improving device reliability.

16 Claims, 5 Drawing Sheets

(52) U.S. Cl.
CPC ...... *H01L 45/1233* (2013.01); *H01L 45/1266* (2013.01); *H01L 45/142* (2013.01); *H01L 45/143* (2013.01); *H01L 45/146* (2013.01); *H01L 45/16* (2013.01)

(56) References Cited

U.S. PATENT DOCUMENTS

| | | | |
|---|---|---|---|
| 2010/0092656 A1 | 4/2010 | Kozicki | |
| 2011/0240946 A1* | 10/2011 | Miao | H01L 45/08 257/3 |
| 2011/0240951 A1* | 10/2011 | Yang | H01L 27/2463 257/5 |
| 2014/0091274 A1* | 4/2014 | Kim | H01L 45/145 257/4 |

OTHER PUBLICATIONS

Chinese Office Action for related Chinese Application No. 201510061926.6; action dated Jan. 25, 2018; (6 pages).
International Search Report for related International Application No. PCT/CN2015/079006; report dated Nov. 8, 2016; (4 pages).

* cited by examiner

NONVOLATILE RESISTIVE SWITCHING MEMORY DEVICE AND MANUFACTURING METHOD THEREOF

PRIORITY CLAIM

The present application is a National Stage of International Application No. PCT/CN2015/079006 filed on May 14, 2015, which claims priority to Chinese Patent Application No. 201510061926.6, filed on Feb. 5, 2015, the entire contents of which are being incorporated herein by reference.

TECHNICAL FIELD

The present invention relates to the field of microelectronics and, more particularly, to a device unit structure with nonvolatile resistive switching memory (RRAM) and a manufacturing method thereof.

BACKGROUND

With the increasing need for high-capacity, low-power storage used for multimedia applications, mobile communications and etc., semiconductor device market shared by non-volatile memory, especially flash memory, is becoming larger and larger, and becoming a very important type of memory. The primary characteristic of the nonvolatile memory is that it can preserve the stored information for a long period of time without power, having both the characteristic of read-only memory and very high access speed.

The nonvolatile memory on the market today is dominated by flash memory, but flash devices have disadvantages such as overhigh operating voltages, low speed of operating, not good enough endurance, and short retention time due to the too thin tunnel oxide layer during the device shrinking. Ideal nonvolatile memory should have the conditions of low operating voltage, simple structure, non-destructive reading, fast operation, long retention time, good endurance and excellent scalability. A number of new materials and devices have been studied to try to achieve the above objectives, in which a significant portion of the new memory devices use the change of resistance value as a way of memory, including resistive switching memory and resistance switching memory adopting solid electrolyte materials.

The resistive switching memory is typically a sandwich structure based on an easily oxidizable metal/solid electrolyte/inert metal, capable of forming a class of important non-volatile resistive switching memories (RRAM, resistive switching memory), commonly referred to as solid electrolyte base RRAM, programmable metallization cell (PMC), or a conductive bridge random access memory (CBRAM). This kind of memories has the advantages of simple structure, fast speed and low power consumption, and is regarded by the industry as one of the strong competitors of the next generation nonvolatile storage technology.

Its working principle is that, under the actuation of applied electric field, the easily anodic oxidizable metal of the metallic upper electrode A (Such as Cu, Ag and Ni, etc.) is oxidized to metal ions $A^+$ under the action of electric field, metal ions $A^+$ is transferred in the solid electrolyte B under the action of electric field, moving toward the cathode and finally reaching the inert lower electrode C, whereat reduced to metal A. As the metal is continuously deposited at the lower electrode C, finally reaching to the upper electrode A, thereby a plurality of filamentous metal conductive bridges connecting the upper and lower electrodes are formed, therefore the device resistance is in a low resistance state; under the action of the reverse electric field, the metal conductive bridges are disconnected, the device is restored to a high resistance state. These two resistive states can be converted to each other by the action of the applied electric field.

However, due to the commonly used inert metal electrode materials (such as Pt, Au, Pd and W, etc.) are polycrystalline structure, resulting that the metal atoms/ions are easily diffused into the inert electrode material to form alloy structure comprised of the easily oxidized metal and inert metal (literature 1, Ycyang, F. Pan, Q. Liu, M. Liu, and F. Zeng, Nano Lett. 9, 1636, 2009), the metal atoms/ions may also migrate to the surface of the inert electrode material through the inert electrode material (literature 2, J J Yang, J P Strachanm, Q. Xia, D A A Ohlberg, P J Kuekes, R D Kelley, W F Stickle, D R Stewart, G. Medeiros-Ribeiro, and R S Williams, Adv. Mater. 22, 4034, 2010). The diffusion of metal atoms/ions into the inert material is equivalent to the formation of easily oxidized metal source in the inert electrode, resulting in erroneous programming phenomenon (forming metal conductive filament under the reverse voltage) of such RRAM devices occurring in the reverse erase process (rupture process of conductive filament), negatively influencing the reliability of the device. At the same time, since the current limiting in this device erasing process is usually much greater than that in the programming process, the erroneous programming phenomenon during the erasing process can easily cause the device hard breakdown and the device failure, affecting the device reliability.

SUMMARY

In view of the above, it is an object of the present invention to overcome the above technical difficulties and to solve the problem of diffusion of the metal conductive filament formed by the active electrode into the inert electrode material during the programming process presented in the RRAM memory device based on the solid electrolytic material, thereby providing a novel device structure with a monolayer or multilayer graphene film added between the inert electrode and the solid electrolyte layer as a metal ion barrier, improving the reliability of the device.

According to one aspect of the present invention, a nonvolatile resistive switching memory comprising an inert metal electrode, a resistive switching functional layer, and an easily oxidizable metal electrode, characterized in that a graphene barrier layer interposed between the inert metal electrode and the resistive switching functional layer, capable of preventing the easily oxidizable metal ions from migrating into the inert metal electrode through the resistive switching functional layer under the action of electric field during the programming of the device.

Wherein the material of the easily oxidizable metal electrode is, for example, at least one of Cu, Ag, Ni, Sn, Co, Fe, Mg, or a combination thereof; optionally, the thickness thereof is 5 nm to 500 nm.

Wherein the material of the resistive switching functional layer is a solid electrolyte or a binary oxide material having resistance switching properties such as any one of CuS, AgS, AgGeSe, $CuI_xS_y$, $ZrO_2$, $HfO_2$, $TiO_2$, $SiO_2$, $WO_x$, NiO, $CuO_x$, ZnO, $TaO_x$, $Y_2O_3$, or a combination thereof; optionally, the thickness thereof is 2 nm to 200 nm.

Wherein the material of the inert metal electrode is, for example, any one of Pt, W, Au, Pd or a combination thereof; optionally, the thickness thereof is, for example, 5 nm to 500 nm.

Wherein the graphene barrier layer is at least one of a monolayer or a multilayer graphene film; optionally, the thickness thereof is 0.5 nm to 20 nm.

The present invention also provides a method of manufacturing the nonvolatile resistive switching memory comprising the steps of: forming an inert metal electrode on an insulating substrate; forming a graphene barrier layer on the inert metal electrode; forming a resistive switching functional layer on the graphene barrier layer; and forming an easily oxidizable metal electrode on the resistive switching functional layer, wherein the graphene barrier layer is capable to prevent the easily oxidizable metal ions from migrating into the inert metal electrode through the resistive switching functional layer under the action of the electric field during the programming of the device.

Wherein the process of forming the inert metal electrode and/or the resistive switching functional layer and/or the easily oxidizable metal electrode are electron beam evaporation, chemical vapor deposition, pulsed laser deposition, atomic layer deposition, magnetron sputtering or sol-gel method.

Wherein, the process of forming the graphene barrier layer is film transfer, tape stripping or chemical vapor deposition.

Wherein the thickness of the inert metal electrode and/or the easily oxidizable metal electrode is 5 nm to 500 nm; optionally, the thickness of the resistive switching functional layer is 2 nm to 200 nm; optionally, the thickness of the graphene barrier layer is 0.5 nm to 20 nm.

Wherein the material of the easily oxidizable metal electrode is, for example, at least one of Cu, Ag, Ni, Sn, Co, Fe, Mg, or a combination thereof; optionally, the material of the resistive switching functional layer is a solid electrolyte or a binary oxide material having resistance switching properties such as any one of CuS, AgS, AgGeSe, $Cu_xS_y$, $ZrO_2$, $HfO_2$, $TiO_2$, $SiO_2$, $WO_x$, NiO, $CuO_x$, ZnO, $TaO_x$, $Y_2O_3$, or a combination thereof; optionally, the material of the inert metal electrode is, for example, any one of Pt, W, Au, Pd or a combination thereof.

Wherein a periodic structure is formed at the interface between the easily oxidizable metal electrode and the resistive switching functional layer.

Wherein the projected area of the graphene barrier layer and the inert metal electrode is respectively larger than the resistive switching functional layer and the easily oxidizable metal electrode, and electrode contact is formed on the exposed graphene barrier layer.

Wherein the easily oxidizable metal electrode is a plurality of split ones.

According to the nonvolatile resistive switching memory device of the present invention and manufacturing method thereof, a monolayer or a multilayer graphene film is added between the inert electrode and the solid electrolyte resistive switching functional layer as a metal ion barrier in order to prevent the metal conductive filament formed in the resistive switching functional layer from diffusing into the inert electrode layer during the programming of the RRAM device, thus eliminating the erroneous programming phenomenon occurring during the erasing process of the device, improving the reliability of the device.

BRIEF DESCRIPTION OF THE DRAWINGS

The technical solution of the present invention will be described in detail below with reference to the accompanying drawings, in which.

DETAILED DESCRIPTION

The characters and technical effects of the present invention will be described in detail by referring the drawings and accommodate with schematic embodiments, disclosing a nonvolatile resistive switching memory device and manufacturing method thereof with a metal ion barrier layer containing a monolayer or a multilayer graphene film for preventing the occurrence of erroneous programming phenomenon during the erasing process of device. It should be noted that the similar signs denote the similar structure. The terms used in the present invention like 'first', 'second', 'up/upon', 'down/low/beneath/under' etc. can be used in denoting various device structures, and unless specially illuminated these terms don't imply to the relationship of space, sequence or hierarchy of the device structures.

Figure 1:
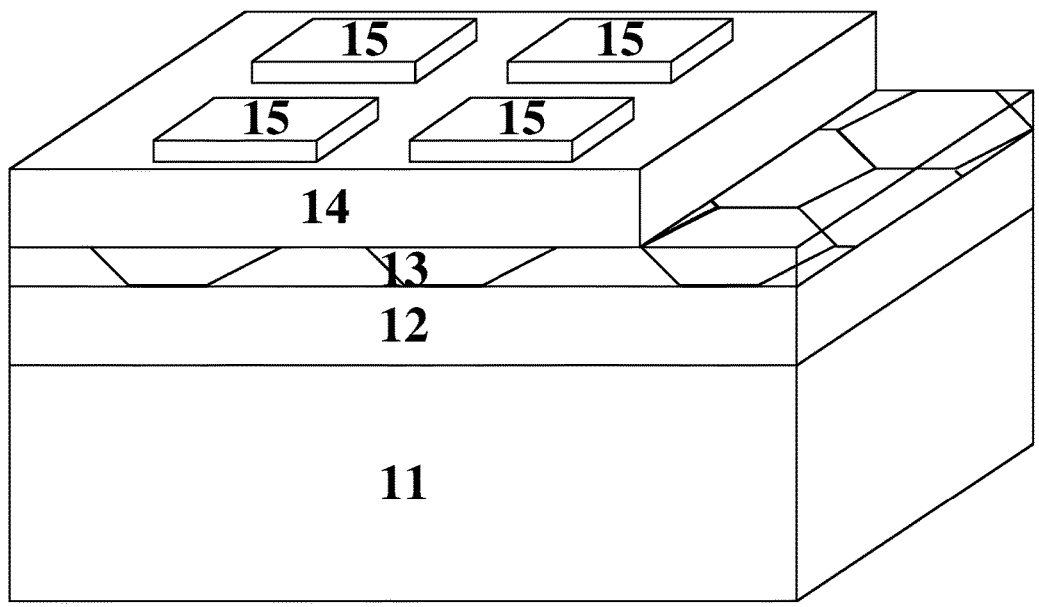
FIG. 1 is a schematic diagram of a nonvolatile resistive switching memory device according to the present invention.

As shown in FIG. 1, a schematic view of a resistive switching memory device according to the present invention is shown, including an insulating substrate 11, an inert metal electrode 12, a resistive switching functional layer 14, a graphene barrier layer 13, and an easily oxidizable metal electrode 15. Wherein the material of the inert metal electrode 12 is at least one of Pt, W, Au and Pd or a combination thereof, and the resistive switching functional layer 14 is made of a solid electrolyte or a binary oxide material having a resistance switching characteristic, and the graphene barrier layer 13 is a monolayer or a multilayer graphene film, and the material of the easily oxidizable metal electrode 15 is at least one of Cu, Ag, Ni, Sn, Co, Fe, Mg, or a combination thereof. During the programming process, the graphene film as a metal ion barrier will prevent the metal ions in the conductive filament from diffusing into the inert electrode layer, thereby, eliminating the phenomenon of erroneous programming in the subsequent erasing process and improving the reliability of the device.

As shown in FIGS. 2A-2D and FIG. 3, the schematic diagrams corresponding to the respective steps of the method of manufacturing the resistive switching memory device according to the present invention are shown.

Figure 2A:
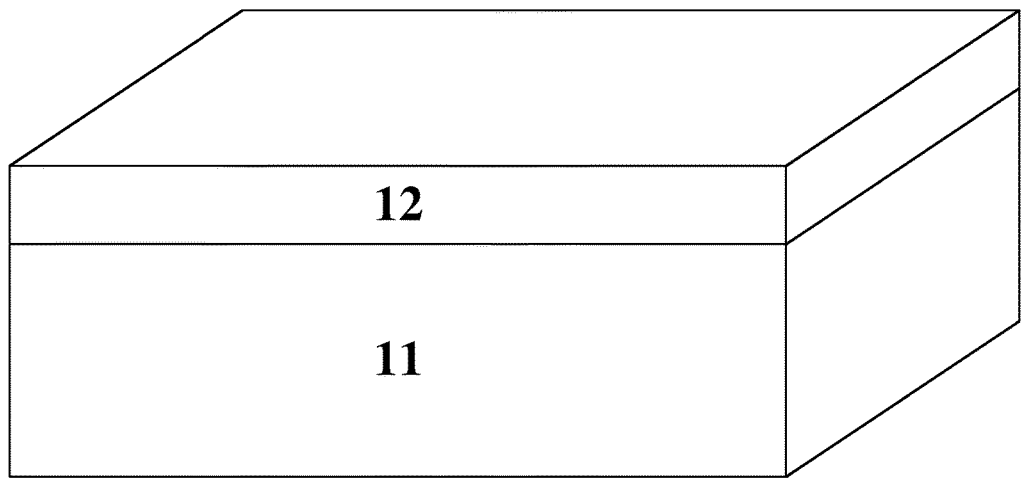
FIGS. 2A-2D are schematic views of a method of manufacturing the nonvolatile resistive switching memory device according to the present invention.

Specifically, as shown in FIG. 2A, an inert metal electrode 12 is formed on the insulating substrate 11. An insulating substrate 11 is provided, which may be a hard substrate such as silicon oxide on Si substrate, buried oxygen layer of SOI substrate, sapphire (alumina), aluminum nitride, glass, or quartz, or flexible substrates such as resin, plastic and etc. By electron beam evaporation, chemical vapor deposition (including PECVD, HDPCVD, MOCVD, etc.), pulsed laser deposition, atomic layer deposition (ALD) or magnetron sputtering, an inert metal electrode 12 comprised of inert metal material are deposited on the insulating substrate 11, the material thereof for example, is any one of Pt, W, Au, and Pd, or a combination thereof; and the thickness thereof, for example, is 5 nm~500 nm, preferably 10 nm~350 nm and optimally 60 nm~150 nm, for example, 100 nm.

Figure 2B:
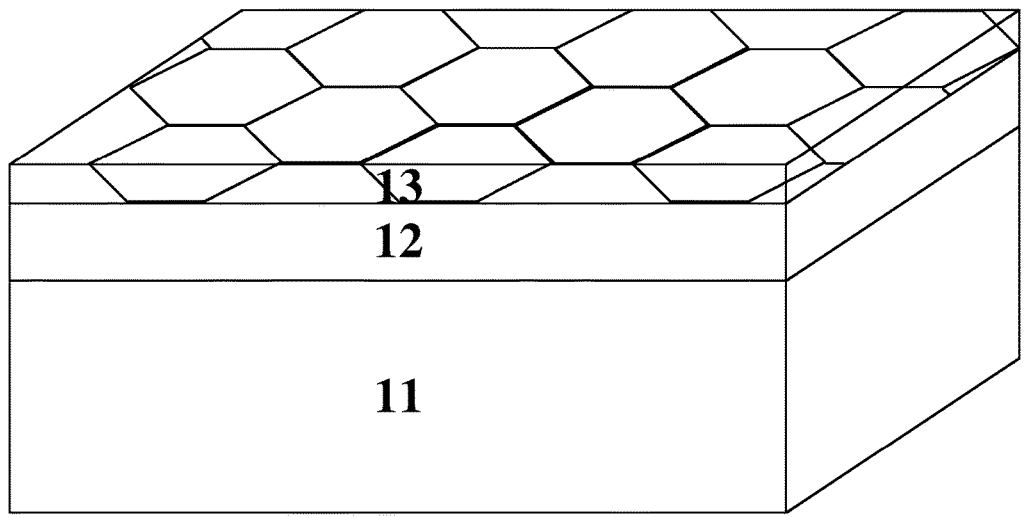
Figure 2C:
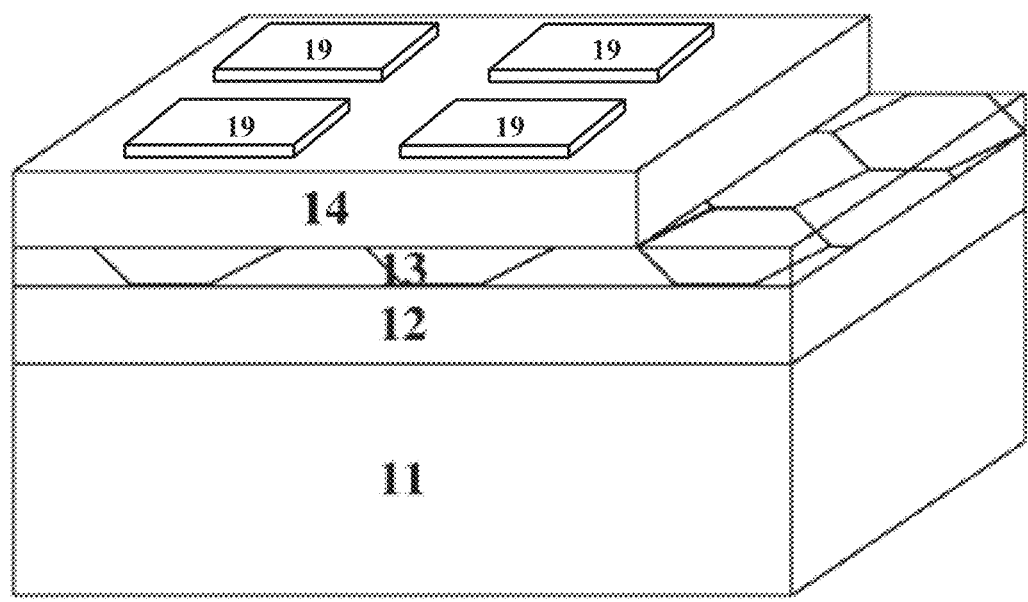

Subsequently, as shown in FIG. 2B, a metal ion barrier layer 13 made of graphene is formed on the inert metal electrode 12. The formation of the graphene film layer may be a film transfer process, and the preparation of the graphene layer may be carried out by tape peeling or chemical vapor deposition. The thickness of the graphene barrier layer is 0.5 nm~20 nm, preferably 1 nm~15 nm, and optimally 5 nm. As a hexagonal grid of two-dimensional structure, the diameter of hexagonal cavity of graphene is 65 pm, much smaller than the atomic size or ion size of most atoms, so graphene is a very effective atomic diffusion barrier material. The graphene barrier layer 13 may be a single layer or a multilayer structure wherein each of the layers is flexible and bendable comparing to other hard barrier layers made of such as Ta, Ti, TiN, or TaN, so the switching memory device's own thickness can be greatly reduced, more easily prepared on a flexible substrate, and further reducing the overall impedance, whereby capable of applying to wearable or low-power electronic devices. Preferably, the projected area of the graphene barrier layer and the inert metal electrode is larger than that of the resistive switching functional layer and the easily oxidizable metal electrode to be formed later, thereby forming an electrode contact on the graphene barrier layer with a stepped structure as shown in FIG. 2C. This can further increase the area of the graphene and inert metal electrodes and reduce the resistance of the device itself so as to be used in low power devices.

Figure 2D:
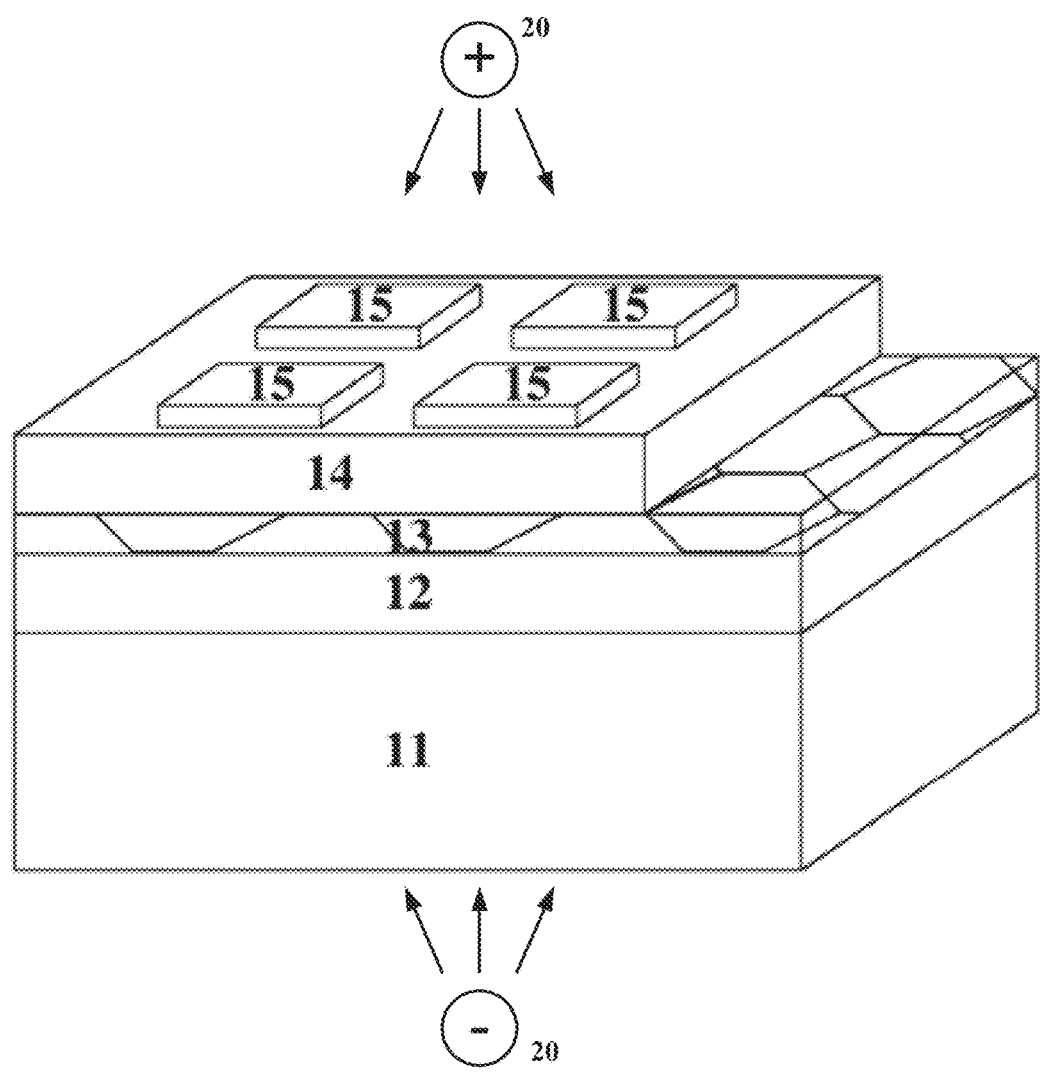
Figure 3:
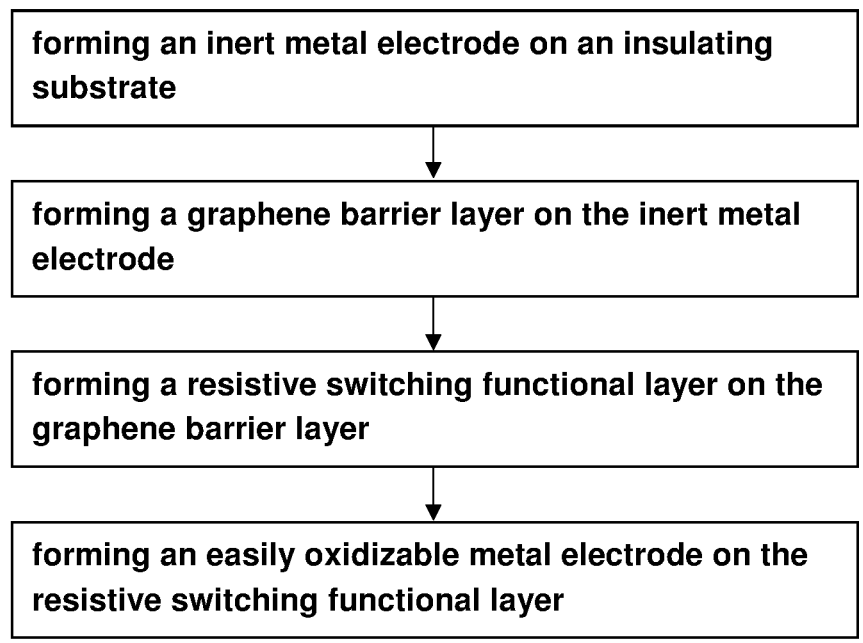
FIG. 3 is a schematic flow chart of a method of manufacturing the nonvolatile resistive switching memory device according to the present invention.

Next, as shown in FIG. 2C, a resistive switching functional layer 14 is formed on the graphene barrier layer 13. The resistive switching functional layer 14 may also be referred to as a resistive switching storage medium layer, which acts as an insulating spacer between the upper and lower electrodes and allows the metal ions of the easily oxidizable electrode 15 to pass through the resistive switching functional layer 14 and reach the graphite barrier layer 13 under the action of an electric field (as shown in FIG. 2D as electric field 20). Since the diameter of the cavity in the two-dimensional structure of the graphene barrier layer 13 is smaller than the size of the metal ions, the metal ions are accumulated only on the barrier layer 13 instead of entering the inert metal electrode 12. During the subsequent erasing process with application of a reverse voltage, all of the metal ions will leave the graphene barrier layer under the action of the electric field, so there is no erroneous erasing. The process of forming the resistive switching functional layer 14 is electron beam evaporation, pulsed laser deposition, magnetron sputtering, or sol-gel method. The resistive switching functional layer 14 is made of a solid electrolyte or a binary oxide material having a resistance transition characteristic, specifically is one of the following CuS, AgS, AgGeSe, CuIxSy, ZrO2, HfO2, TiO2, SiO2, WOx, NiO, CuOx, ZnO, TaOx, Y2O3 or a combination (including mixing, lamination, doping modification and the like) thereof, with a thickness in the range of 2 nm to 20 nm, preferably 5 nm to 100 nm, preferably 10 nm to 60 nm, and optimally 40 nm.

Finally, as shown in FIG. 2D, an easily oxidizable electrode 15 is formed on the resistive switching functional layer 14. The electrode 15 is formed by electron beam evaporation, chemical vapor deposition, pulsed laser deposition, atomic layer deposition or magnetron sputtering, and the material of which is an easily oxidizable metal material such as at least one of the following materials—Cu, Ag, Ni, Sn, Co, Fe, Mg—or a combination thereof (E.g., in the form of an alloy or a lamination), the thickness of which ranges from 5 nm to 500 nm, preferably from 10 nm to 300 nm and optimally from 50 to 100 nm, such as 80 nm. Preferably, prior to depositing the electrode 15, a periodic pattern (shown in FIG. 2C as periodic pattern 19) is formed on the top surface of the resistive switching functional layer 14 by using a mask plate or periodically controlling the deposition process parameters, or etching after deposition, in order to increase the contact area between the electrode 15 and the resistive switching functional layers 14, thereby improving the efficiency of programming and erasing. Preferably, after formation of the electrode layer 15, it is divided into a plurality of small area electrodes by etching or depositing with mask, thereby reducing the quantity demanded of the easily oxidizable metal electrode material and further reducing the probability of the easily oxidized metal ion migrating into the inert metal electrode 12, and thus improving the device reliability.

In one embodiment of the present invention, firstly, using an electron beam evaporation process, a Pt thin film of 70 nm is magnetically sputtered on a Si substrate with a 200 nm thick SiO$_2$ insulating layer as an inert metal electrode layer; then, a graphene film is transferred to the inert metal electrode layer by tape stripping, and then a resistance functional layer made of ZrO$_2$ with thickness of 20 nm is deposited by magnetron sputtering deposition; finally, a Cu layer with thickness of 100 nm is evaporated by an electron beam as an easily oxidizable electrode Layer, so as to complete the basic structure of the entire device. FIG. 2 shows a schematic of the process flow of this embodiment. By comparing the electrical characteristics of the nonvolatile resistive switching memory device grown under the same process conditions without the graphene barrier layer, it has been found that the addition of this layer of graphene barrier layer can significantly reduce the phenomenon of erroneous programming of the device during erasing, thus improving the reliability of the device.

In other embodiments of the present invention, the easily oxidizable metal electrode 15, the graphene barrier layer 13, the resistive switching functional layer 14, and the inert metal electrode layer 12 may be sequentially deposited on the insulating substrate 11 in the order different from the above-described processes, while other materials and thickness dimensions thereof remain unchanged.

According to the nonvolatile resistive switching memory device of the present invention and manufacturing method thereof, a monolayer or multilayer graphene film is added between the inert electrode and the solid electrolyte resistive switching functional layer as a metal ion barrier in order to prevent the metal conductive filament formed in the resistive switching functional layer from diffusing into the inert electrode layer during the programming of the RRAM device, eliminating the erroneous programming phenomenon occurring during the erasing process of the device, and improving the reliability of the device.

Although the present invention is described with one or more specifically exemplary embodiments, one skilled in the art will recognize that various appropriate changes and equivalents of the device structure can be made without departing from the scope of the present invention. Furthermore, a great deal of modifications of specific situation or materials can be made to the disclosed enlightenment without departing from the scope of the present invention. Thus, the intent of the present invention is not limiting itself to the disclosed specifically exemplary embodiments for implementing the best implementary manner, by contraries, the disclosed device structures and the method of manufacturing the same will include all the exemplary embodiments within the scope of the invention.

What is claimed is that:

1. A nonvolatile resistive switching memory, sequentially comprising:

an inert metal electrode;

a graphene barrier layer;

a resistive switching functional layer; and an easily oxidizable metal electrode, collectively located on a substrate, characterized in that the graphene barrier layer is capable of preventing ions of the easily oxidizable metal electrode from migrating into the inert metal electrode through the resistive switching functional layer under an action of an electric field provided during a programming of the nonvolatile resistive switching memory, thus eliminating erroneous programming in erasing processes, wherein the inert metal electrode is located between the substrate and the graphene barrier layer, and wherein the easily oxidizable metal electrode is located above the resistive switching functional layer.

2. The nonvolatile resistive switching memory of claim 1, wherein the easily oxidizable metal electrode includes at least one of Cu, Ag, Ni, Sn, Co, Fe, Mg, or a combination thereof; optionally, a thickness of the easily oxidizable metal electrode is between 5 nm to 500 nm.

3. The nonvolatile resistive switching memory of claim 1, wherein the resistive switching functional layer includes a solid electrolyte or a binary oxide material having resistance switching properties comprising any one of CuS, AgS, AgGeSe, $CuI_xS_y$, $ZrO_2$, $HfO_2$, $TiO_2$, $SiO_2$, $WO_x$, NiO, $CuO_x$, ZnO, $TaO_x$, $Y_2O_3$, or a combination thereof; optionally, a thickness of the resistive switching functional layer is between 2 nm to 200 nm.

4. The nonvolatile resistive switching memory of claim 1, wherein the inert metal electrode includes any one of Pt, W, Au, Pd or a combination thereof; optionally, a thickness of the inert metal electrode is between 5 nm to 500 nm.

5. The nonvolatile resistive switching memory of claim 1, wherein the graphene barrier layer is at least one of a monolayer or a multilayer graphene film; optionally a thickness of the graphene barrier layer is between 0.5 nm to 20 nm.

6. The nonvolatile resistive switching memory of claim 1, wherein a periodic structure is formed between the easily oxidizable metal electrode and the resistive switching functional layer in order to increase a contact area between the easily oxidizable metal electrode and the resistive switching functional layer.

7. The nonvolatile resistive switching memory of claim 1, wherein a surface area of the graphene barrier layer and the inert metal electrode is larger than a surface area of the resistive switching functional layer and the easily oxidizable metal electrode.

8. The nonvolatile resistive switching memory of claim 1, wherein the easily oxidizable metal electrode is a plurality of split easily oxidizable metal electrodes.

9. A method of manufacturing a nonvolatile resistive switching memory, comprising steps of:

forming an inert metal electrode on an insulating substrate;

forming a graphene barrier layer on the inert metal electrode;

forming a resistive switching functional layer on the graphene barrier layer; and forming an easily oxidized metal electrode on the resistive switching functional layer, wherein the graphene barrier layer is capable to prevent ions of the easily oxidized metal electrode from migrating into the inert metal electrode through the resistive switching functional layer under an action of an electric field provided during a programming of the nonvolatile resistive switching memory, thus eliminating erroneous programming in erasing processes, wherein the inert metal electrode is located between the substrate and the graphene barrier layer, and wherein the easily oxidizable metal electrode is located above the resistive switching functional layer.

10. The method of manufacturing the nonvolatile resistive switching memory of claim 9, wherein forming at least one of the inert metal electrode, the resistive switching functional layer, or the easily oxidizable metal electrode includes at least one process of: electron beam evaporation, chemical vapor deposition, pulsed laser deposition, atomic layer deposition, magnetron sputtering, or a sol-gel method.

11. The method of manufacturing the nonvolatile resistive switching memory of claim 9, wherein, forming the graphene barrier layer includes at least one process of: film transfer, tape stripping, or chemical vapor deposition.

12. The method of manufacturing the nonvolatile resistive switching memory of claim 9, wherein a thickness of at least one of the inert metal electrode or the easily oxidizable metal electrode is between 5 nm to 500 nm; optionally, a thickness of the resistive switching functional layer is between 2 nm to 200 nm; and optionally, a thickness of the graphene barrier layer is between 0.5 nm to 20 nm.

13. The method of manufacturing the nonvolatile resistive switching memory of claim 9, wherein, the easily oxidizable metal electrode includes at least one of Cu, Ag, Ni, Sn, Co, Fe, Mg, or a combination thereof; optionally, the resistive switching functional layer includes a solid electrolyte or a binary oxide material having resistance switching properties comprising any one of CuS, AgS, AgGeSe, $CuI_xS_y$, $ZrO_2$, $HfO_2$, $TiO_2$, $SiO_2$, $WO_x$, NiO, $CuO_x$, ZnO, $TaO_x$, $Y_2O_3$, or a combination thereof; optionally, the inert metal electrode includes any one of Pt, W, Au, Pd or a combination thereof.

14. The method of manufacturing the nonvolatile resistive switching memory of claim 9, wherein, a periodic structure is formed between the easily oxidizable metal electrode and the resistive switching functional layer in order to increase a contact area between the easily oxidizable metal electrode and the resistive switching functional layer.

15. The method of manufacturing the nonvolatile resistive switching memory of claim 9, wherein, a surface area of the graphene barrier layer and the inert metal electrode is larger than a surface area of the resistive switching functional layer and the easily oxidizable metal electrode.

16. The method of manufacturing the nonvolatile resistive switching memory of claim 9, wherein, the easily oxidizable metal electrode is split into a plurality of electrodes.

* * * * *